US007657696B2

(12) United States Patent
Su et al.

(10) Patent No.: US 7,657,696 B2
(45) Date of Patent: Feb. 2, 2010

(54) METHOD TO DETECT NAND-FLASH PARAMETERS BY HARDWARE AUTOMATICALLY

(75) Inventors: Zhiqiang J. Su, San Jose, CA (US); Qasim R. Shami, Fremont, CA (US); Hongping Liu, Milpitas, CA (US); Hui Lan, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 251 days.

(21) Appl. No.: 11/067,501

(22) Filed: Feb. 25, 2005

(65) Prior Publication Data
US 2006/0195650 A1   Aug. 31, 2006

(51) Int. Cl.
*G06F 13/00* (2006.01)
*G06F 13/28* (2006.01)
*G06F 9/26* (2006.01)
*G06F 9/34* (2006.01)
*G06F 9/00* (2006.01)
*G06F 9/24* (2006.01)
*G06F 15/177* (2006.01)

(52) U.S. Cl. ............................ 711/103; 711/218; 713/1; 713/2

(58) Field of Classification Search .................. 711/103, 711/218; 713/1, 2
See application file for complete search history.

(56) References Cited

U.S. PATENT DOCUMENTS 5,535,357 A * 7/1996 Moran et al. ................. 711/103
2003/0172261 A1* 9/2003 Lee et al. ......................... 713/1
2004/0017708 A1* 1/2004 Choi et al. ................... 365/200
2005/0108500 A1* 5/2005 Kishida et al. ............... 711/218

OTHER PUBLICATIONS

"The Authoritative Dictionary of IEEE Standards and Terms" Seventh Edition, Standards Information Network IEEE Press, Copyright 2000 p. 168 and 264.*
Andrew S. Tanenbaum "Structured Computer Organization", 1999, Alan Apt, fourth edition, p. 8.*
Samsung Electronics, 256M×8 Bit / 128M×16 Bit NAND Flash Memory, May 19, 2004.

* cited by examiner

*Primary Examiner*—Matt Kim
*Assistant Examiner*—Michael Alsip
(74) *Attorney, Agent, or Firm*—Christopher P. Maiorana, PC (57) ABSTRACT

A method for automatically detecting a plurality of parameters for a NAND-Flash memory. A first step of the method may include generating a plurality of address cycles for the NAND-Flash memory. A second step may set an address number parameter of the parameters based on (i) a first number of the address cycles generated and (ii) a status signal generated by the NAND-Flash memory responsive to the address cycles. A third step generally includes generating at least one read cycle for the NAND-Flash memory after determining the address number parameter. A fourth step may set a page size parameter of the parameters based on (i) a second number of the read cycles generated and (ii) the status signal further responsive to the read cycles.

21 Claims, 7 Drawing Sheets

TABLE III

| | 256+8 BYTE/PAGE | 512+16 BYTE/PAGE | | 2K+64 BYTE/PAGE | |
|---|---|---|---|---|---|
| | | 8 BIT NAND-FLASH | 16 BIT NAND-FLASH | 8 BIT NAND-FLASH | 16 BIT NAND-FLASH |
| 1ST CYCLE | A[7:0] | A[7:0] | A[8:1] | A[7:0] | A[8:1] |
| 2ND CYCLE | A[15:8] | {1'b0,A[15:9]} | {1'b0,A[15:9]} | {4'b0,X,A[10:8]} | {6'b0,X,A[10:9]} |
| 3RD CYCLE | 0x00 | 0x00 | 0x00 | {3'b0,A[15:11]} | {3'b0,A[15:11]} |
| 4TH CYCLE | 0x00 | 0x00 | 0x00 | 0x00 | 0x00 |
| 5TH CYCLE | 0x00 | 0x00 | 0x00 | 0x00 | 0x00 |

METHOD TO DETECT NAND-FLASH PARAMETERS BY HARDWARE AUTOMATICALLY

FIELD OF THE INVENTION

The present invention relates to a method for parameter detection generally and, more particularly, to a method to detect NAND-Flash parameters by hardware automatically.

BACKGROUND OF THE INVENTION

A NAND-Flash memory is one type of memory used in many different applications. Compared with NOR-Flash memory, the NAND-Flash has advantages of low cost and high capacity. NAND-Flash is widely used in many different applications such as MP3 players, digital cameras and thumb drives. A SmartMedia™ Card has the same signal name and timing with an 8-bit NAND-Flash memory. ("SmartMedia" is a trademark of Toshiba Corporation, Tokyo, Japan.) Usually, a SmartMedia™ card is just a NAND-Flash with a card package. Unlike NOR-Flash or ROM, interface timing at a NAND-Flash is complex. Since the NAND-flash memory does not have explicit address pins, a read access is not straightforward. A series of address and command cycles with proper timing are issued before data can be read out of the NAND-Flash memory. Furthermore, different types of NAND-Flash memories have different number of address cycles and command sequences.

Due to the variable attributes of the NAND-Flash architecture, no clear way exists to read the contents of any particular NAND-Flash memory directly. A central processing unit (CPU) conventionally controls the access cycles to the NAND-Flash memory once the interface parameters are known. Automated detection of the interface parameters for the particular NAND-Flash memory typically involves software or firmware-based solutions executed by the CPU. In another conventional approach, a NAND-Flash device ID can be used to detect the NAND-Flash manufacture and type. Once the manufacture and type are known, the CPU can read the appropriate interface parameters from a database stored in another memory. Therefore, based on the current technology, the CPU cannot be booted directly from NAND-Flash. As a result, additional external ROM or NOR-Flash memory is commonly implemented to boot the CPU so that the CPU can detect or read the NAND-Flash memory interface parameters.

The CPU and the extra memory add to the cost and complexity of the application system. The software or firmware for parameter detection increases a complexity of the application system. Parameter detection is relatively slow. A boot-up speed for the software/firmware-based NAND-Flash boot-up approaches are much slower than a pure hardware-based solution. Furthermore, new NAND-Flash designs cannot be accommodated without changing the software, firmware or database.

SUMMARY OF THE INVENTION

The present invention concerns a method for automatically detecting a plurality of parameters for a NAND-Flash memory. A first step of the method may include generating a plurality of address cycles for the NAND-Flash memory. A second step may set an address number parameter of the parameters based on (i) a first number of the address cycles generated and (ii) a status signal generated by the NAND-Flash memory responsive to the address cycles. A third step generally includes generating at least one read cycle for the NAND-Flash memory after determining the address number parameter. A fourth step may set a page size parameter of the parameters based on (i) a second number of the read cycles generated and (ii) the status signal further responsive to the read cycles.

The objects, features and advantages of the present invention include providing a method to automatically detect NAND-Flash memory parameters by hardware that may (i) operate without a processor, (ii) be implemented in a relatively small area, (iii) be implemented at a low cost (iv) enable a system boot-up from a NAND-Flash memory, (v) directly read data from the NAND-Flash memory, (vi) enable instruction execution from the NAND-Flash memory and/or (vii) eliminate a need for other ROM memories and NOR-Flash memories in the system.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention provides a method (or process) and a circuit (or system) to automatically detect a plurality of interface parameters of a NAND-Flash memory (or device). Hereafter, "NAND-Flash" generally refers to a NAND-Flash memory and/or a SmartMedia™ card. The invention may be used in application specific integrated circuits (ASIC) that interfaces to one or more NAND-Flash devices. The method/hardware provides automatic detection of the NAND-Flash parameters and thus enables a system or system on a chip (SOC) to be directly boot up from a NAND-Flash memory. In a system without a host central processing unit (CPU), the method/hardware may provide great flexibility in terms of the types of NAND-Flash that may be supported.

Communications through a NAND-Flash interface generally involve several parameters: (i) a data bus width parameter, (ii) a page size parameter, (iii) an address number parameter indicating a number of address cycles used to read data, (iv) a read command sequence parameter. Once the number of address cycles for a data read and a read command sequence has been detected, the number of address cycles for a block erase and a page program may be easily calculated. For example, the number of address cycles for a page program may be the same as the number of address cycles for a data read. The number of address cycles for a block erase may be calculated by subtracting two from the number of the address cycles for a page program, if page size is 2 kilobytes (KB), otherwise subtracting one.

Each of the interface parameters generally has one among multiple possible values, depending on the manufacturer and the memory type. In particular, the data bus width may be an 8-bit or a 16-bit width. Other data bus widths may be implemented to meet the criteria of a particular design. The number of address cycles used for a data read may include (i) a 3-address cycle, (ii) a 4-address cycle and (iii) a 5-address cycle.

The page size parameter may be one of (i) 256+8 bytes, (ii) 512+16 bytes or (iii) 2048+64 bytes. Other page sizes may be implemented. A general format of the page size may be X+Y. The X value generally defines a normal data area size of a page. The Y value may indicate a spare or redundant area size. The spare area may be used for error correction coding (ECC), status bytes and the like.

The read command sequence may be any of several sequence types. A sequence type one generally includes (i) a first command latch cycle (e.g., CMD00), (ii) 3 to 5 address latch cycles, (iii) a ready/busy check and (iv) one or more data read cycles. A sequence type two may include (i) the first command latch cycle (e.g., CMD00), (ii) the 3 to 5 address latch cycles, (iii) a second command latch cycles (e.g., CMD30), the ready/busy check (iv) and the one or more data read cycles. Note, for the CMD00 and the CMD30, values of 00 hexadecimal and 30 hexadecimal are generally placed on the data bus, respectively. The extra second command latch cycle (e.g., CMD30) is generally used for the second sequence type.

Figure 1:
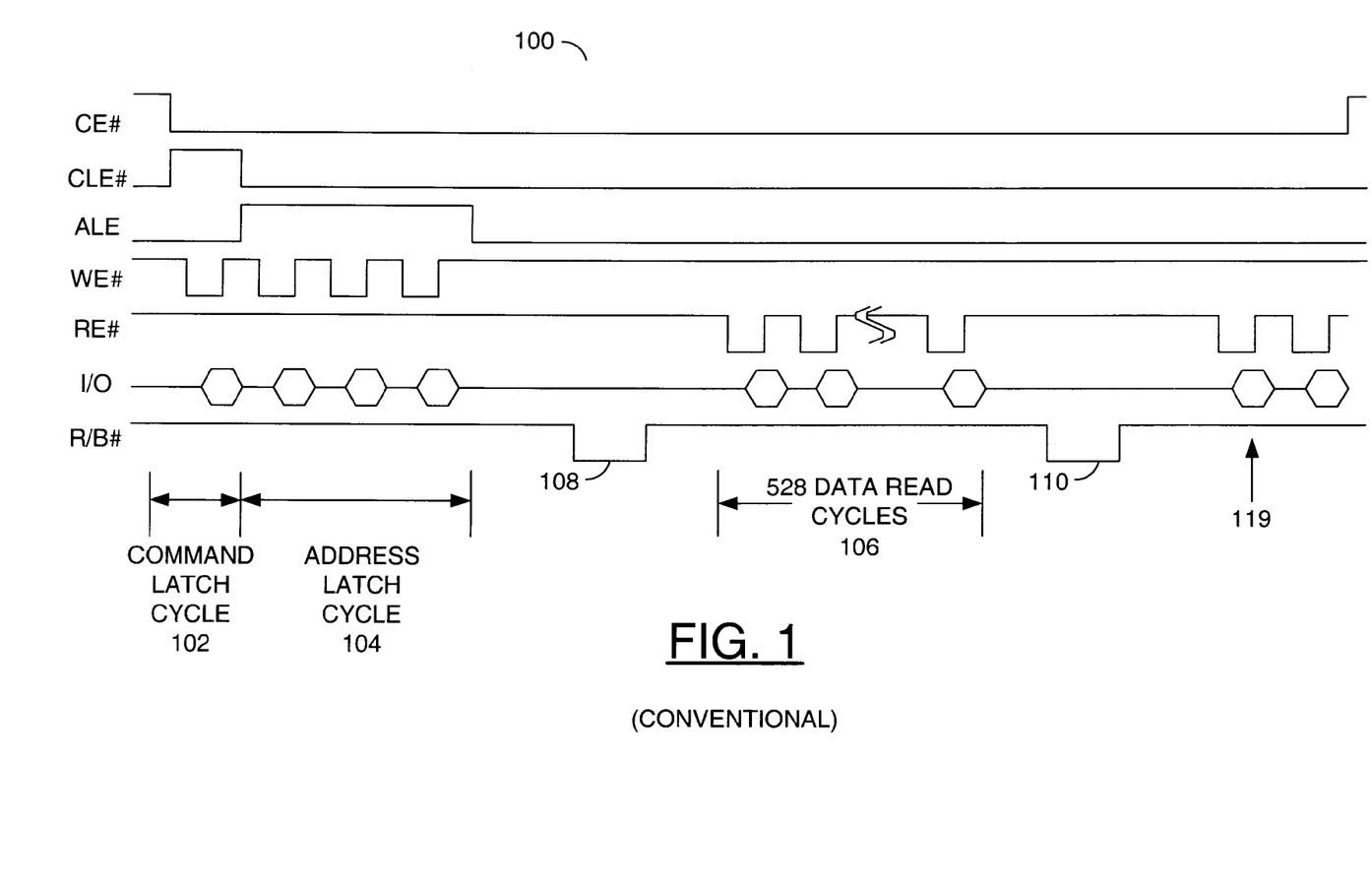
FIG. 1 is a timing diagram of a conventional read cycle.

Referring to FIG. 1, a timing diagram of a conventional read cycle 100 is shown. The basic NAND-Flash read cycle 100 may illustrate an 8-bit NAND-Flash memory with 528 bytes per page. A number of the address cycles in the example is three. The read cycle 100 generally comprises a command latch cycle 102, an address latch cycle 104 and a read cycle 106.

A signal (e.g., CE#) may be referred to as a device (or chip) select input signal. The NAND-Flash memory may be selected while the signal CE# is in an active low state (e.g., a logical zero), and deselected while the signal CE# is in a deasserted high state (e.g., a logical one).

A signal (e.g., CLE#) may be referred to as a command latch enable signal. The signal CLE# may be an input signal generally controlling latching of commands into the NAND-Flash memory. The signal CLE# may be active in the low state.

A signal (e.g., ALE) may be referred to as an address latch enable signal. The signal ALE may be an input signal to control latching of an address into the NAND-Flash memory. The signal ALE may be active in the high state.

A signal (e.g., WE#) may be referred to as a write enable signal. The signal WE# may be an input signal for control writing of commands, addresses and/or data to the NAND-Flash memory. The commands, addresses and data may be latched within the NAND-Flash memory on a rising edge of the signal WE#. In one embodiment, latching may be performed on a falling edge of the signal WE#.

A signal (e.g., RE#) may be referred to as a read enable signal. The signal RE# may be an output signal for indicating when the read data is valid at an input/output (I/O) interface of the NAND-Flash memory. The read data may be valid a delay period after a falling edge of the signal RE#. In one embodiment, the read data may be valid on a rising edge of the signal RE#.

A signal (e.g., I/O) may be referred to as a data input/output signal. The signal I/O may be bidirectional. The signal I/O may carry commands, address and data information in a time multiplexed fashion. The signal I/O may have an n-bit width generally matching the data bus width parameter.

A signal (e.g., R/B#) may be referred to as a ready/busy status signal. The signal R/B# may be an output signal indicating a status of the NAND-Flash memory. While in a busy state (e.g., the logical low state), the status signal R/B# generally indicates that the NAND-Flash memory is busy. The status signal R/B# in a ready state (e.g., the logical high state) generally indicates that the NAND-Flash memory has completed an operation and is available for a new command.

The status signal R/B# is generally driven to the busy state during each read access within the read cycle 106 under any of the following conditions. After the command latch cycle 102 and the address latch cycle 104, and before the data read cycle 106, the NAND-Flash memory generally pulls the status signal R/B# low for a short time 108 (e.g., about 20 microseconds (μs)) in order to read a whole page of data to an internal page register. For the 512+16 bytes per page NAND-Flashes and the 256+8 bytes per page NAND-Flashes, after the read cycle 106 is complete and while the chip select signal CE# is still asserted, the NAND-Flash may pull the status signal R/B# to the busy state for a time 110 while reading a next page of data to the page register.

Timing specified for the NAND-Flash memory interface generally includes restrictions on the commands and the address values in the signal I/O. In particular, the values for the address latch cycle 104 and the command latch cycle 102 may be received through the least significant 8 bits of the signal I/O, even for a 16-bit NAND-Flash device. Furthermore, if the read starts from a first byte of a first page of a first block, then the address values are generally zeros for each address latch cycle 104.

Auto-detection hardware and methodology for the NAND-Flash input parameters are generally based on the above knowledge. Example detailed timing information regarding the command latch cycle 102, the address latch cycle 104, the data read cycle 106 and other detail timings may be found in a NAND-Flash data sheet K9K2G08U0M, Jan. 27, 2004, by Samsung Electronic Company, Seoul, South Korea, hereby incorporated by reference in its entirety.

Figure 2:
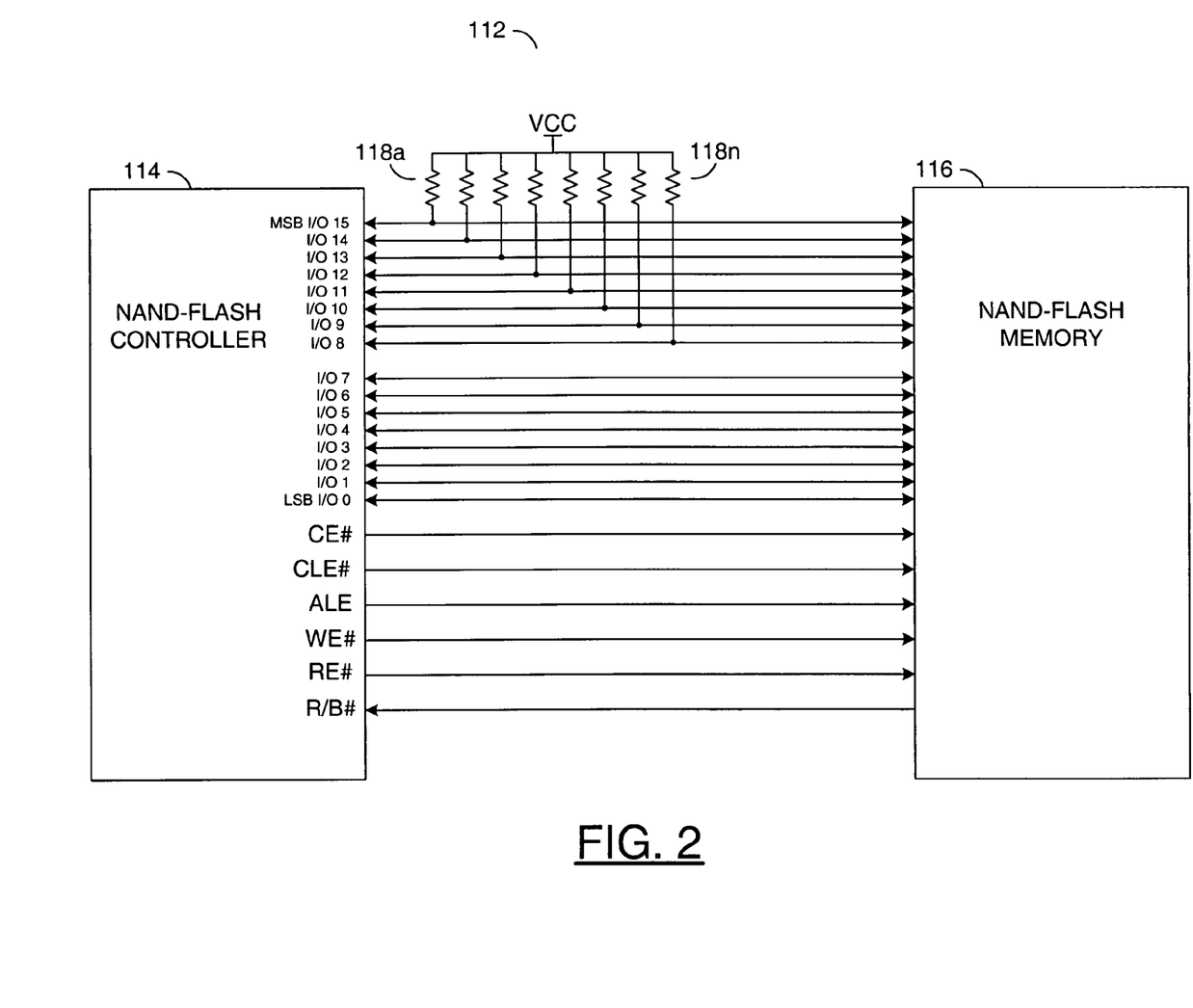
FIG. 2 is a block diagram of an example circuit in accordance with a preferred embodiment of the present invention.

Referring to FIG. 2, a block diagram of an example circuit 112 is shown in accordance with a preferred embodiment of the present invention. The circuit (or system) 112 generally comprises a circuit (or module) 114, a memory (or module) 116 and optional resistors 118a-118n. The circuit 114 may be referred to as a NAND-Flash controller circuit 114 or just controller circuit 114 for short. The memory 116 may be implemented as a NAND-Flash memory.

The controller circuit 114 may be directly connected to the NAND-Flash memory 116 via multiple lines carrying the signals I/O, CE#, CLE#, ALE, WE#, RE# and R/B#. The optional resistors 118a-118n may be disposed between the upper (most significant) bit lines of a bus carrying the signal I/O and a logical high power source (e.g., Vcc) if the signal I/O is greater than an 8-bit signal.

The resistors 118a-118n may be implemented as weak pull-up resisters. The resistors 118a-118n generally pull the 8 most significant bits (MSB) of the signal I/O to a value of 0×FF if no memory device 116 drives the upper bits. The MSB 8-bit data may be sampled by the controller circuit 114 at a rising edge of the signal RE# in each data read cycle (e.g., time 106 in FIG. 1). If any bit of the data is not a logical one, the NAND-Flash memory 116 may be considered to have a greater than 8-bit data bus (e.g., 16-bit data bus).

Figure 3:
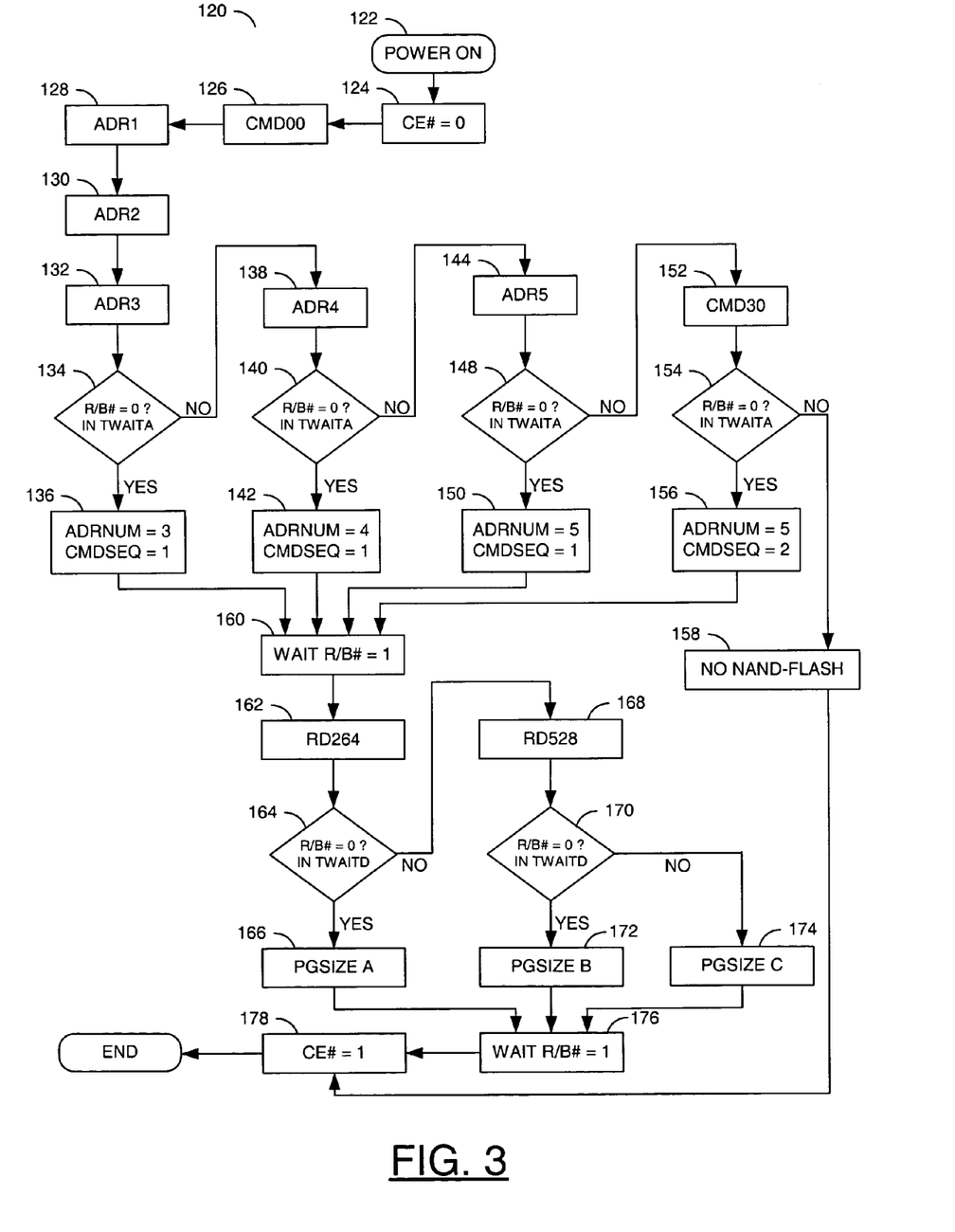
FIG. 3 is a flow diagram of an example method for detecting parameters.

Referring to FIG. 3, a flow diagram of an example method 120 for detecting parameters is shown. The method (or process) 120 generally comprises a step (or state) 122, a step (or state) 124, a step (or state) 126, a step (or state) 128, a step (or state) 130, a step (or state) 132, a step (or state) 134, a step (or state) 136, a step (or state) 138, a step (or state) 140, a step (or state) 142, a step (or state) 144, a step (or state) 148, a step (or state) 150, a step (or state) 152, a step (or state) 154, a step (or state) 156, a step (or state) 158, a step (or state) 160, a step (or state) 162, a step (or state) 164, a step (or state) 166, a step (or state) 168, a step (or state) 170, a step (or state) 172, a step (or state) 174, a step (or state) 176 and a step (or state) 178. The method 120 may be implemented as a state machine or similar circuit in hardware logic.

After power on (e.g., step 122), the following sequential steps may be carried out by the controller circuit 114 to detect a parameter for the number of address cycles needed for a page read operation from the NAND-Flash memory 116. In steps 124 through 132 respectively, the controller circuit 114 may generate a sequence of the first command cycle followed by 3 address cycles (e.g., CMD00, ADR1, ADR2, ADR3) in the signal I/O to the NAND-Flash memory 116. A check on the status signal R/B# may be performed in step 134 during a first predefined period (e.g., TWAITA). If the status signal R/B# is in the busy state (e.g., the YES branch of step 134), the address number parameter is 3 (e.g., ADRNUM=3) and a command sequence parameter may be set to the type one sequence (e.g., CMDSEQ=1) in step 136.

If the status signal R/B# does not come into the busy state during the first period TWAITA (e.g., the NO branch of step 134), an additional address cycle (e.g., ADR4) may be performed in step 138 and the check of the status signal R/B# may be done again in step 144 during a second period TWAITA. If the status signal R/B# is in the busy state (e.g., the YES branch of step 140), the address number parameter is generally detected as 4 (e.g., ADRNUM=4) and the command sequence parameter may be set to the type one sequence (e.g., CMDSEQ=1) in step 142.

If the status signal R/B# does not come into the busy state during the second period TWAITA (e.g., the NO branch of step 140), a fifth address cycle (e.g., ADR5) may be carried out in step 144. The fifth address cycle is generally a maximum number of address cycles recognized by the NAND-Flash memory 116. In the process of detecting the address number parameter, the period TWAITA may be useful in the detection scheme. The TWAITA parameter may be derived based on the formula:

tWB<TWAITA<tR+tWB

Where the parameter tWB may be defined as a time between the signal WE# transitioning to the logical high state and the status signal R/B# transitioning to the busy state (e.g., 100 to 200 nanoseconds (ns)). The parameter tR may be defined as a time for the data transfer from a memory cell to a register both internal to the NAND-Flash memory 116 (e.g., approximately 10 to 25 μs).

A detection may be performed in the method 120 between the two types of command sequence (i) the command sequence type one and (ii) the command sequence type two, as described above. After determining the number of address cycles parameter (e.g., the address number parameter), the controller circuit 114 may check the status signal R/B# in step 148 to see if the status signal R/B# becomes busy within a third period TWAITA. If the status signal R/B# is in the busy state (e.g., the YES branch of step 148), the address number parameter may be detected as 5 (e.g., ADRNUM=5) and the command sequence parameter may be detected as the type one sequence (e.g., CMDSEQ=1) in step 150.

If R/B# does not become busy within the third period TWAITA after the fifth address cycle ADR5 (e.g., the NO branch of step 148), the second command value CMD30 may be issued by the controller circuit 114 in step 152. If the status signal R/B# goes into the busy state during a fourth period TWAITA (e.g., the YES branch of step 154), the address cycle parameter may be considered as 5 (e.g., ADRNUM=5) and the command sequence may be considered detected as the type two sequence (e.g., CMDSEQ=2) in step 156. Otherwise, if the status signal R/B# remains in the ready state (e.g., the NO branch of step 154), the controller circuit 114 may conclude in step 158 that no NAND-Flash memory is connected.

After the address number parameter and the address sequence parameter have been determined, the controller circuit 114 may detect the page size parameter. The controller circuit 114 generally waits until the status signal R/B# is in the ready state at step 160. Once the status signal R/B# is in the ready state, the controller circuit 114 may initiate a read cycle of 264 data items in step 162. Step 164 may check on the status signal R/B# after a first period (e.g., TWAITD). If the status signal R/B# is in the busy state (e.g., the YES branch of step 164), the controller circuit 114 may conclude that a one page read has finished. The page size parameter may be set to a first page size (e.g., PGSIZE A) in step 166. The parameter TWAITD may be derived based on the following formula:

tRB<TWAITD<tR+tRB

Where the parameter tRB is generally a time from a last transition of the signal RE# from the high state to the busy state (e.g., 100 to 200 ns). The parameter tR is generally a time for the data transfer from a cell to a register both within the NAND-Flash memory 116 (e.g., approximately 10 to 25 μs).

If the status signal R/B# does not come into busy state during the first period TWAITD (e.g., the NO branch of step 164), the controller circuit 114 may issue another read cycle for another 264 data items in step 168 (e.g., effectively a read cycle of 528 data items). Another check of the status signal R/B# may be performed in step 170 during a second period TWAITD. If the status signal R/B# is in the busy state at the end of the second period (e.g., the YES branch of step 170 ), the page size parameter may be set to a second size (e.g., PGSIZE B) in step 172 If the status signal R/B# does not come into busy state during the second period TWAITD (e.g., the NO branch of step 170 ), the controller circuit 114 may set the page size parameter to a third size (e.g., PGSIZE C) in step 174 The page size parameters may be defined such that PGSIZE A<PGSIZE B<PGSIZE C.

The page size parameter may be detected based on the states and the data bus width as shown in the TABLE I as follows:

TABLE I

| State | 8-bit data bus | 16-bit data bus |
|---|---|---|
| PGSIZE A | 256 + 8 Bytes per page | 512 + 16 Bytes per page |
| PGSIZE B | 512 + 16 Bytes per page | Undefined |
| PGSIZE C | 2K + 64 Bytes per page | 2K + 64 Bytes per page |

After all of the parameters are detected by the controller circuit 114, the status signal R/B# may be checked again in step 176. The controller circuit 114 will generally wait until the status signal R/B# transitions to the ready state, then deassert the signal CE# in step 178. Thereafter, other circuits in a system incorporating the NAND-Flash memory 116 and controller circuit 114 may use the detected interface parameters to access the NAND-Flash memory 116.

System on a chip (SOC) designs are conventionally booted from an on-chip or off-chip NOR-flash device or ROM device, but not from a NAND-Flash device. Several factors result in the difficulty of using NAND-Flash memory directly as a boot-up device. As mentioned above, NAND-flash devices generally lack explicit address pins and read accessing is not straightforward. Therefore, a series of address and command cycles with proper timing criteria should be issued before data may be read out of the NAND-flash. In addition, different types of NAND-Flash devices may have different numbers of address cycles and command sequences. Furthermore, only the data in a first block of the NAND-Flash device may be guaranteed to be correct. The structure of a NAND-Flash is similar to a hard disk. NAND-Flash devices were generally designed for storing data, not for storing the first instructions read by the CPU after a power on. Due to the above reasons, conventional systems often boot up from other types of memory. In contrast, the present invention generally provides an architecture and method that may enable the system to boot up directly from a NAND-Flash device. A boot-up performance of the NAND-Flash device is made be similar to a boot-up performance of a NOR-Flash device.

Each byte of a NAND-Flash memory generally has a unique system address. A CPU boot up address section may be mapped to the first block of the NAND-Flash memory to enable booting from the NAND-Flash device. For example, a CPU (e.g., an ARM 922 RISC processor) may boot up from an address 0xFFFF0000. A common NAND-Flash memory having 512+16 bytes per page usually has more than one thousand pages. The first 256 pages of the NAND-Flash memory may be mapped to the CPU addresses according to TABLE II as follows:

TABLE II

| Address on the CPU bus | NAND-Flash pages |
| --- | --- |
| 0xFFFF0000 to 0xFFFF01FF | 1st page normal area of the first block |
| 0xFFFF0200 to 0xFFFF03FF | 2nd page normal area of the first block |
| ... | ... |
| 0xFFFFFE00 to 0xFFFFFFFF | 256th page normal area |

Figure 4:
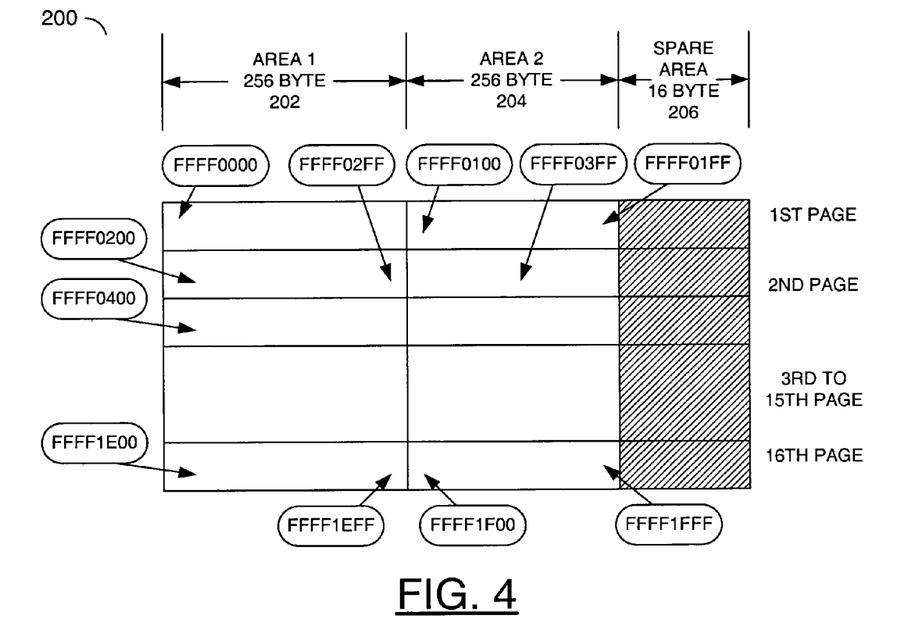
FIG. 4 is a diagram of an example mapping of NAND-Flash pages to a processor address space.

Referring to FIG. 4, a diagram of an example mapping 200 of NAND-Flash pages to a CPU address space is shown. A first block of a NAND-Flash memory generally has a predetermined (e.g., 16 or 64) number of pages. The mapping 200 may illustrate 16 pages, which is 8 kilobytes (KB) equivalent of normal data. A boot-up program for CPU should fit entirely within the first block.

Each page generally comprises a first area 202, a second area 204 and third area 206. The first area 202 generally comprises multiple (e.g., 256) bytes in each of the pages. The second area 204 may comprise multiple (e.g., 256) bytes in each of the pages. The third area 206 generally comprises several (e.g., 16) spare bytes in each of the pages.

The diagram generally illustrates several characteristics of the mapping 200. In particular, the CPU address may successively cross a normal page area boundary (e.g., area 202 to area 204). The CPU addresses may be mapped to more than one page. Therefore, a span of each page generally crosses the page boundary of the NAND-Flash memory. The spare area 206 may not be mapped to the CPU addresses space because the first block (e.g., the first 16 or 64 pages) may be guaranteed to be error free. The spare area 206 is generally designed to store error correction codes (ECC), index bytes and the like. In another mapping, the spare area may be accessible by the CPU for reading ECC information to correct data. The spare area 206 may be directly mapped to the CPU addresses or the spare area 206 may be accessed by other methods. Normal data blocks may be defined as the blocks after the first block. The normal blocks should also be accessible by the CPU. However, the normal blocks may not be directly mapped to the CPU addresses. A smart direct memory access (DMA) controller, or other similar design, may be used to improve a performance or simplify the mapping.

Figure 5:
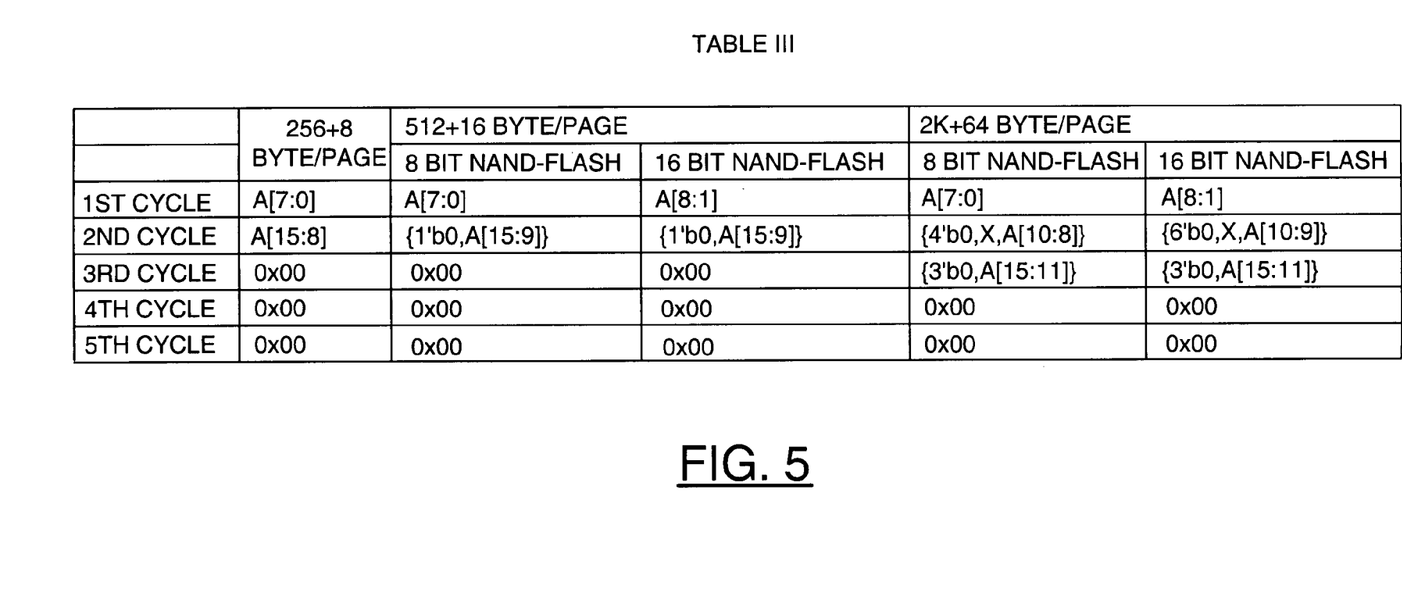
FIG. 5 is a table showing a sequence of mapping addresses to input/output signals.

Referring to FIG. 5, a TABLE III showing a sequence of mapping addresses to the signal I/O is provided. The CPU address space generally follows a set rule for mapping to NAND-Flash address cycle sequence. Examples of how the CPU addresses may be mapped to various NAND-Flash address cycles is generally provided in the TABLE III. For the CPU address range of 0xFFFF0000 to 0xFFFFFFFF, a 64 KB total space is shown in Table III. The value X should be 0 for a normal data block access. While the value of X is 1, the address may point to the NAND-Flash spare area. The eighth address bit may not be used in the 8-bit 512+16 Byte/Page NAND-Flash, as commands may be used to distinguish the 256-byte boundary.

Figure 6:
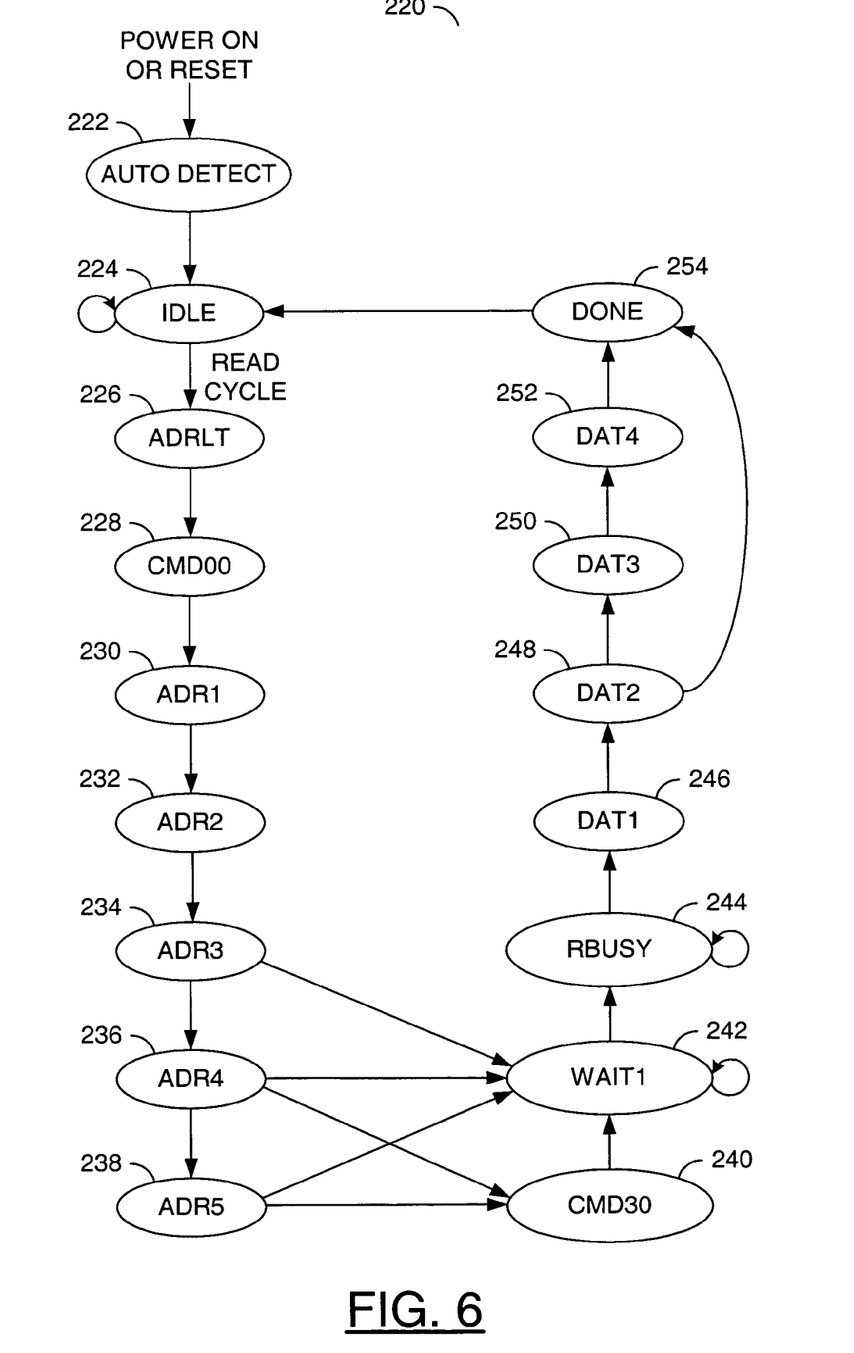
FIG. 6 is a state diagram for an example state machine for booting up a system directly from a NAND-Flash memory.

Referring to FIG. 6, a state diagram for an example state machine 220 for booting up a system directly from a NAND-Flash memory is shown. The state machine 220 generally comprises a state 222, a state 224, a state 226, a state 248, a state 230, a state 232, a state 234, a state 236, a state 238, a state 240, a state 242, a state 244, a state 246, a state 248, a state 250, a state 248, a state 252 and a state 248, a state 252.

The state diagram generally shows how the hardware fetches (reads) data from a NAND-Flash device. In the example illustrate, the CPU may operate on 32-bit data. If the CPU operates on 64-bit (8 byte) data, then 8 data read pulses may be used to read from an 8-bit NAND-Flash memory. The state machine 220 generally works for different endiness systems by merging the byte data in different orders.

The state machine 220 may power up in an AUTO DETECT state (e.g., state 222). The AUTO DETECT state is generally a state in which the hardware automatically detects the NAND-Flash parameters as discussed earlier. During the auto detection, the CPU bus may be held in a wait state.

In an IDLE state (e.g., state 224), the state machine 220 generally waits for any CPU-to-NAND-Flash-access request. The request may be a first CPU instruction fetch request after power on. The CPU read address may be saved in D-type flip-flop (not shown) in an ADRLT state (e.g., state 226). If an interface between a NAND-Flash controller (e.g., the controller circuit 114) and the CPU (or other master processor) is a pipeline based bus, such as an Advanced High-Performance Bus (AHB) bus, the address may be latched because the current address generally disappears in a next clock cycle.

The state CMD00 (e.g., state 228) may be the NAND-Flash command cycle described above. For the state CMD00, the command value is generally set to 0x00. For the state CMD30 (e.g., state 240), the command value is generally set to 0x30. A command value of 0x50 may be used to read access the spare area (e.g., area 206) of the NAND-Flash memory. A command value of 0x01 may be used to read access main and redundant sections starting from the area 2 (e.g., area 204). A command value of 0x00 may be used to read access main and redundant section starting from the area 1 (e.g., area 202).

In the address states, ADR1 (e.g., state 230), ADR2 (e.g., state 232), ADR3 (e.g., state 234), ADR4 (e.g., state 236) and ADR5 (e.g., state 238), the values of the addresses generally follow TABLE III. The CPU addresses may be re-mapped to the NAND-Flash addresses in the address states 230-238. The number of address cycles generally depends on a capacity and the type of the NAND-Flash memory, automatically detectable by the hardware.

The optional state CMD30 (e.g., state 240) may be used in a 2K+64 Byte/Page NAND-Flash mode. Otherwise, the state machine 220 may transition to a next state. The state WAIT1 (e.g., state 242), may be a state in which the NAND-Flash controller delays for a certain time before advancing to a next state. The delay may be calculated base on the following formula:

tWB+2×Tclock<Wait Time<tR where the parameter tWB is generally a time between the signal WE# transitioning to the high state and the signal R/B# transitioning to the busy state, (e.g., approximately 100 to 200 ns). The parameter Tclock may be defined as a cycle time of an internal clock. The parameter tR may be a time for transferring data from a cell to a register both within the NAND-Flash memory (e.g., approximately 10 to 25 µs). A reason to add to Tclock is that the status signal R/B# may be asynchronous with the internal clock and thus a double synchronization may be applied to the status signal R/B# adding two more internal clock cycles. Since the parameter tR is generally much bigger than the parameter tWB, a reasonable wait time may be easily determined for the WAIT1 state 242.

A state RBUSY (e.g., state 244) is a state in which the status signal R/B# may be sampled. The state machine 220 generally remains in the RBUSY state 244 until the status signal R/B# signal is detected as asserted high (e.g., ready).

States DAT1 (e.g., state 246), DAT2 (e.g., state 248), DAT3 (e.g., state 250) and DAT4 (e.g., state 252) may be data read cycles as described above. If the NAND-Flash memory has a 16-bit signal I/O, two data states may be used to form a 32-bit data word. Data from the two data states may be merged differently, depending on the CPU endiness. A state DONE (e.g., state 254) generally means that the data read is finished and the signal CE# may be deasserted. After deasserting the signal CE#, the state machine 220 may return to the IDLE state 224.

In one embodiment, the following hardware design rules may be implemented. Since the data sequentially read from the NAND-Flash device may be fast, a prefetch buffer may be added to the NAND-Flash controller to improve performance. The prefetch buffer size may have a length of one or two CPU cache lines. The state machine 220 should hold (or stall) the CPU by inserting wait states until the data is returned. Moreover, the state machine 220 should hold the CPU in a wait state if the automatic detection process is in the middle of processing. The NAND-Flash memory may only guarantees the data in the first block is error-free. Data integrity in other blocks is generally not guaranteed. In fact, the NAND-Flash can guarantee that there is one or less than one bit error in the non-first block pages.

Figure 7:
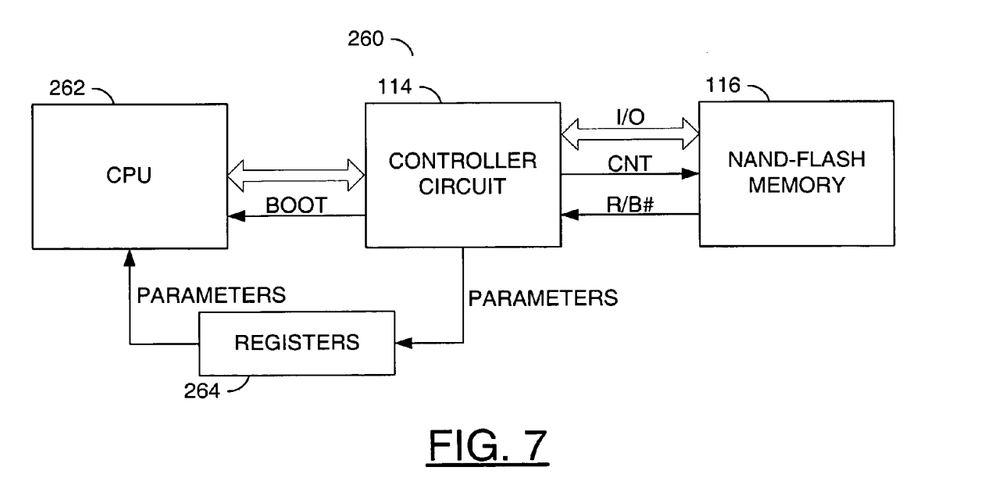
FIG. 7 is a block diagram of a system in which the present invention may be applied.

Referring to FIG. 7, a block diagram of a system 260 in which the present invention may be applied is shown. The system (or circuit) 260 generally comprises a CPU 262, the controller circuit 114, the NAND-Flash memory 116, and one or more registers 264. The system 260 may be implemented as a system on a chip circuit. The SOC circuit 260 may be bootable from the NAND-Flash memory 116. The signals CE#, CLE#, ALE, WE# and RE# may be represented in the figure as a signal group (e.g., CNT).

To boot the SOC circuit 260, the controller circuit 114 may automatically detect the parameters for the NAND-Flash memory 116 as described above. The controller circuit 114 may store the parameters in the registers 264, which may be readable by the CPU 262. The controller circuit 114 may assert a signal (e.g., BOOT) to the CPU 262 to inform the CPU 262 that the parameters may be available in the registers 264. The CPU 262 may respond to the assertion of the signal BOOT by booting from the NAND-Flash memory 116 using the parameters stored in the registers 264.

Figure 8:
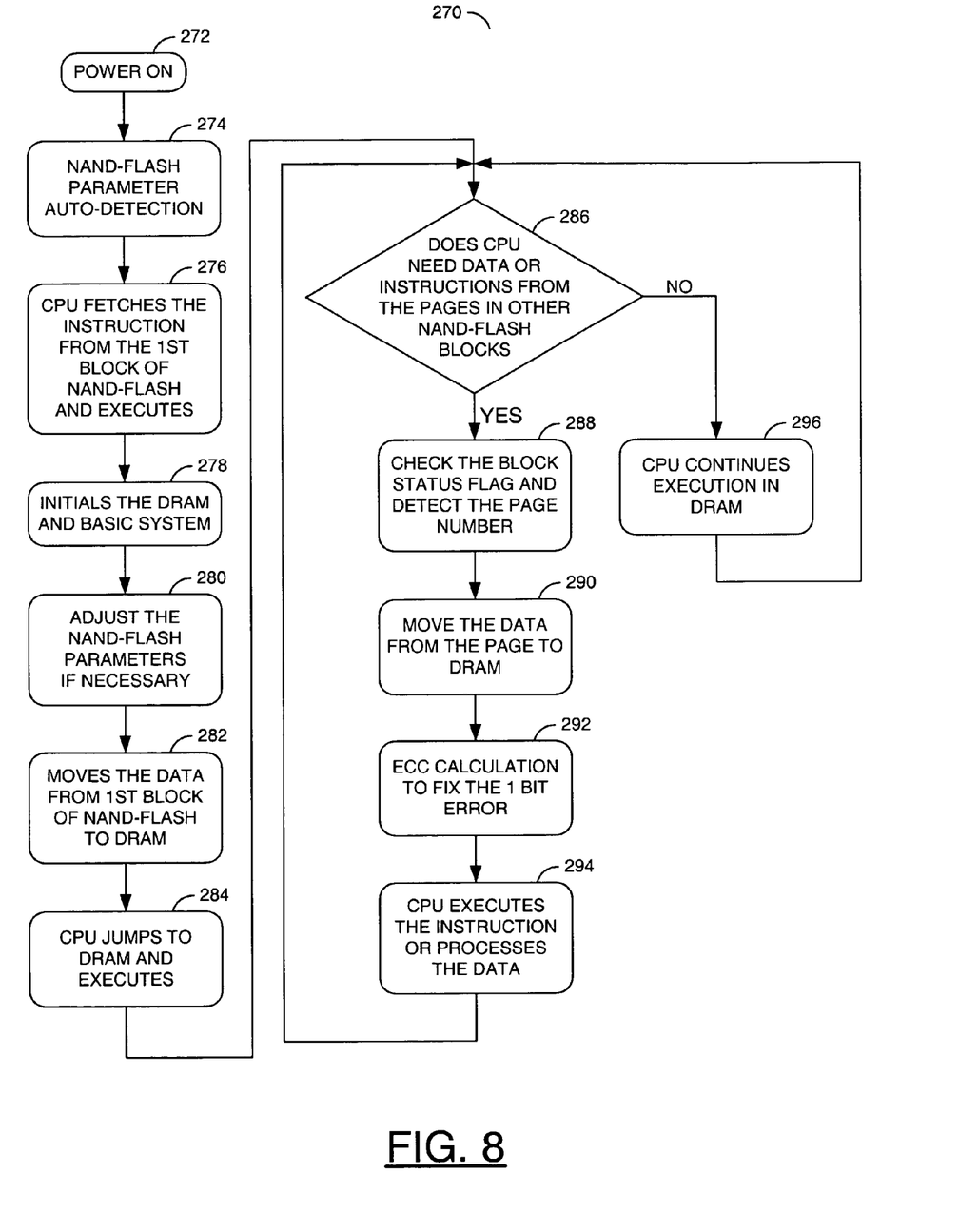
FIG. 8 is a flow diagram of an example method for a CPU boot-up sequence from a NAND-Flash memory.

Referring to FIG. 8, a flow diagram of an example method 270 for a CPU boot-up sequence from a NAND-Flash memory is shown. The method (or process) 270 generally comprises a step (or block) 272, a step (or block) 274, a step (or block) 276 a step (or block) 278, a step (or block) 280, a step (or block) 282, a step (or block) 284, a step (or block) 286, a step (or block) 288, a step (or block) 290, a step (or block) 292, a step (or block) 294 and a step (or block) 296. The CPU may fetch data from the NAND-Flash memory. Code stored in the NAND-Flash memory may be directly executed by the CPU if read from a first block of the NAND-Flash memory. Otherwise, error correction may be performed.

The method 270 generally beings at power on in step 272. A controller circuit (e.g., controller circuit 114) may automatically detect the interface parameters for communicating with the NAND-Flash memory (e.g., memory 116) in step 274. Once the parameters have been detected, a CPU (e.g., CPU 262) may fetch and execute instructions from the first block in the NAND-Flash memory in step 276. The instructions executed by the CPU may include (i) an initialization of dynamic random access memory (DRAM) and other basic system modules in step 278 and (ii) adjust the NAND-Flash parameters in step 280, if appropriate. The instructions stored in the first block of the NAND-Flash memory may be copied to the DRAM in step 282. Execution may continue from the instructions stored in the DRAM in step 284.

If the CPU needs data or more instructions from other than the first block of the NAND-Flash memory (e.g., the YES branch of step 286), the CPU may check a block status flag and detect a new page number of the data/instructions in step 288. The new page may then be copied from the NAND-Flash memory to the DRAM in step 290. If any errors are detected in the data/instructions, the ECC code copied from the new page in the NAND-Flash memory may be used to correct the error in step 292. Execution may continue with the just-copied data/instructions read from the DRAM in step 294. The method 270 may return to step 286 to determine is yet another new page should be copied from the NAND-Flash memory. If the data and instructions needed by the CPU are in the DRAM (e.g., the NO branch of step 286), the CPU may continue execution from the DRAM in step 296.

The present invention generally provides a new scheme of automatic hardware detection of NAND-Flash interface parameters. A controller circuit (e.g., state machine) may be designed to detect a NAND-Flash bus width. In addition, by taking full use of the timing characteristics of the NAND-Flash device, the controller circuit may identify other parameters such as address cycles and read command cycles. Furthermore, a NAND-Flash page size may be determined. With no assistance of host CPU or software, the controller circuit may be applied to wide range of NAND-Flash based devices.

The present invention may provide automatic detection of the NAND-Flash interface parameters by hardware. Furthermore, the detection may be independent of the manufacturer and type of NAND-Flash device providing a flexible solution. A hardware-only implementation of the present invention generally operates faster than CPU/software-based solutions.

Since CPU assistance is not used to detect the NAND-Flash parameters, a system boot may be initiated from the NAND-Flash memory without any other ROM or NOR- Flash. An absence of any other ROM or NOR-Flash memory generally reduces an overall system cost. The present invention may be applied in any SOC design that uses a large nonvolatile memory. Using a single NAND-Flash memory or module instead of multiple other nonvolatile memories may also significantly reduce the system overall cost.

The function performed by the flow diagrams and state diagrams of FIGS. 3, 6 and 8 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product that may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMs, EPROMS, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for automatically detecting a plurality of parameters of a NAND-Flash memory, comprising the steps of:
   (A) transferring a plurality of first addresses from a controller to said NAND-Flash memory;
   (B) waiting during a first window of time to determine if a status signal transitions from a first state to a second state in response to said first addresses, said status signal being generated by said NAND-Flash memory, said first window starting upon transferring a last of said first addresses;
   (C) changing an address representation of an address parameter of said parameters of said NAND-Flash memory from a default number to a first number in response to and after said status signal transitions during said first window, said first number matching a total number of said first addresses that were transmitted while said address representation was said default number;
   (D) transferring a read command to said NAND-Flash memory in response to and after both (i) said address representation changes from said default number to said first number and (ii) said status signal transitions from said second state to said first state;
   (E) waiting during a second window of time to determine if said status signal transitions from said first state to said second state in response to said read command, said second window starting upon transferring said read command; and
   (F) changing a page size representation of a page size parameter of said parameters from another default number to a second number in response to and after said status signal transitions during said second window.

2. The method according to claim 1, further comprising the step of:
   transferring a first latch command to said NAND-Flash memory prior to transferring said first addresses while said address representation is said default number.

3. The method according to claim 1, further comprising the step of:
   changing a command representation of a command parameter of said parameters to a first type in response to both (i) said first number matching one among a plurality of predetermined numbers, a smallest of said predetermined numbers being at least three and (ii) said status signal transitioning from said first state to said second state during said first window, said first window ending a first time after transferring said last first address, said first time being greater than and approximately matching a longest delay of said NAND-Flash memory to respond to said last first address.

4. The method according to claim 3, further comprising the step of:
   transferring a second address to said NAND-Flash memory in response to said status signal remaining in said first state during all of said first window.

5. The method according to claim 4, further comprising the step of:
   changing said command representation to a second type in response to said status signal transitioning from said first state to said second state during a third window, said third window (i) starting in response to transferring said second address and (ii) ending said first time after transferring said second address.

6. The method according to claim 1, further comprising the step of:
   asserting a boot signal using said controller in response to and after both (i) changing said address representation to said first number and changing said page size representation to said second number and (ii) storing said first number and said second number in a register.

7. The method according to claim 6, further comprising the steps of:
   reading said first number and said second number from said register by a central processing unit responding to assertion of said boot signal, said central processing unit and said controller being separate from each other; and
   reading an initial instruction of a boot code directly from said NAND-Flash memory by said central processing unit, said reading being based upon said first number and said second number.

8. The method according to claim 1, further comprising the step of:
   copying a first page from said NAND-Flash memory to a memory under control of a central processing unit.

9. The method according to claim 8, further comprising the step of:
   executing by said central processing unit from said memory upon completing said copying.

10. The method according to claim 9, further comprising the step of:
    copying a second page from said NAND-Flash memory to said memory in response to said central processing unit requesting an instruction stored in said second page of said NAND-Flash memory and not in said first page in said memory, said second page being different than said first page.

11. A system comprising:
    a NAND-Flash memory having a plurality of parameters; and a controller configured to (i) transfer a plurality of first addresses to said NAND-Flash memory, (ii) wait during a first window of time to determine if a status signal transitions from a first state to a second state in response to said first addresses, said status signal being generated by said NAND-Flash memory, said first window starting upon transfer of a last of said first addresses, (iii) change an address representation of an address parameter of said parameters from a default number to a first number in response to and after said status signal transitions during said first window, said first number matching a total number of said first addresses that were transmitted while said address representation was said default number, (iv) transfer a read command to said NAND-Flash memory in response to and after both (a) said address representation changes from said default number to said first number and (b) said status signal transitions from said second state to said first state, (v) wait during a second window of time to determine if said status signal transitions from said first state to said second state in response to said read command, said second window starting upon transferring said read command, and (vi) change a page size representation of a page size parameter of said parameters from another default number to a second number in response to and after said status signal transitions from said first state to said second state during said second window.

12. The system according to claim 11, wherein said controller is further configured to transfer a first latch command to said NAND-Flash memory prior to generating said first addresses while said address representation is said default number.

13. The system according to claim 11, wherein said controller is further configured to change a command representation of a command parameter of said parameters to a first type in response to both (i) said first number matching one among a plurality of predetermined numbers, a smallest of said predetermined numbers being at least three, and (ii) said status signal transitioning from said first state to said second state during said first window, said first window ending a first time after transferring said last address, said first time being greater than and approximately matching a longest delay of said NAND-Flash memory to respond to said last address.

14. The system according to claim 13, wherein said controller is further configured to transfer a second address to said NAND-Flash memory in response to said status signal remaining in said first state during all of said first window.

15. The system according to claim 14, wherein said controller is further configured to change said command representation to a second type in response to said status signal transitioning from said first state to said second state during a third window, said third window (i) starting in response to transferring said second address and (ii) ending said first time after transferring said second address.

16. The system according to claim 11, wherein said controller is implemented as hardware-only.

17. The system according to claim 11, further comprising a central processing unit, said central processing unit and said controller being separate from each other, and said central processing unit being in communication with said controller to receive said first number and said second number.

18. The system according to claim 17, wherein:
said controller is further configured to assert a boot signal to inform said central processing unit when said parameters have been determined; and
said central processing unit is further configured to read an initial instruction of a boot code directly from said NAND-Flash memory based upon said first number and said second number.

19. The system according to claim 11, wherein said controller is further configured to detect a bus width representation of a bus width parameter of said parameters in response to both a read enable signal and data read from said NAND-Flash memory.

20. A system comprising:
a NAND-Flash memory;
a controller implemented as hardware-only and configured to determine a plurality of parameters of said NAND-Flash memory by communicating with said NAND-Flash memory, wherein said controller determines said parameters by (i) transferring a plurality of first addresses to said NAND-Flash memory, (ii) waiting during a first window of time to determine if a status signal transitions from a first state to a second state in response to said first addresses, (iii) changing an address representation of an address Parameter of said parameters to a first number in response to and after said status signal transitions during said first window, (iv) transferring a read command to said NAND-Flash memory in response to and after both (a) said address representation changes to said first number and (b) said status signal transitions from said second state to said first state, (v) waiting during a second window of time to determine if said status signal transitions from said first state to said second state in response to said read command and (vi) changing a page representation of a page parameter of said parameters to a second number in response to and after said status signal transitions from said first state to said second state during said second window; and
a central processing unit configured to read an initial instruction of a boot code directly from said NAND-Flash memory based on said parameters as determined by said controller, said central processing unit and said controller being separate from each other.

21. The system according to claim 20, wherein said controller further determines said parameters by (A) changing a command representation of a command parameter of said parameters to a first type in response to both (i) said first number matching one among a plurality of predetermined numbers, a smallest of said predetermined numbers being at least three and (ii) said status signal transitioning from said first state to said second state during said first window, said first window ending in response to said NAND-Flash memory having a first time to respond to said last address, (B) transferring a second address to said NAND-Flash memory in response to said status signal remaining in said first state during all of said first window and (C) changing said command representation to a second type in response to said status signal transitioning from said first state to said second state during a second window, said second window ending in response to said NAND-Flash memory having said first time to respond to said second address.

* * * * *